United States Patent [19]

Kawai et al.

[11] 4,148,090
[45] Apr. 3, 1979

[54] APPARATUS FOR CONTROLLING AN ELECTROMAGNETIC VALVE

[75] Inventors: Hisasi Kawai, Toyohashi; Toshikazu Ina, Okazaki, both of Japan

[73] Assignee: Nippon Soken, Inc., Nishio, Japan

[21] Appl. No.: 874,482

[22] Filed: Feb. 2, 1978

[30] Foreign Application Priority Data

Feb. 8, 1977 [JP] Japan .................................. 52-13171

[51] Int. Cl.$^2$ ........................................... H01H 47/04
[52] U.S. Cl. ..................................... 361/152; 361/154
[58] Field of Search ......................... 361/152, 153, 159

[56] References Cited

U.S. PATENT DOCUMENTS

| 3,628,102 | 12/1971 | Jauch et al. | 361/154 |
| 3,786,314 | 1/1974 | Misch | 361/154 |
| 3,864,604 | 2/1975 | Normile et al. | 361/154 |

Primary Examiner—Harry E. Moose, Jr.
Attorney, Agent, or Firm—Cushman, Darby & Cushman

[57] ABSTRACT

In an apparatus for controlling an electromagnetic valve which is adapted for use with the fuel injection systems of internal combustion engines, after the expiration of a predetermined time the control of the energization of the electromagnetic coil of the electromagnetic valve is changed from constant-voltage control to constant-current control, and any surge voltage caused during the control change is selectively absorbed, thereby ensuring stable energization of the electromagnetic valve despite variations in the supply voltage or the like.

7 Claims, 8 Drawing Figures

APPARATUS FOR CONTROLLING AN ELECTROMAGNETIC VALVE

BACKGROUND OF THE INVENTION

The present invention relates to improvements in and relating to an apparatus for controlling an electromagnetic valve which is adapted for use in controlling for example, the injection of fuel in an internal combustion engine.

In an electronically-controlled fuel injection system, an electromagnetic valve is provided on an engine for supplying fuel in response to a pulse signal. The electromagnetic valve includes therein an electromagnetic coil and a valve member arranged in such a manner that the valve member is opened to supply said engine with the fuel while the electromagnetic coil is energized in response to the pulse signal.

It is known in this field of art that the electromagnetic coil requires a large amount of electric energy at the beginning of energization to open the valve member from closed position, whereas it requires a small amount of electric energy after the valve member has been fully opened.

For the purpose of decreasing the electric energy consumption without deteriorating response in valve opening operation, it has been suggested in Japanese Patent 50-7211 published on Mar. 24, 1975 (U.S. Patent application 130,349 filed on Apr. 1, 1971) that the electromagnetic valve is subjected to a constant voltage control and then to a constant current control. Changing the constant voltage control to the constant current control is effected when the electric current flowing to the electromagnetic coil exceeds a predetermined value. Although this control mode is advantageous in that the electric energy consumption is decreased to a minimum and necessary amount, the suggested sequential controls cannot be effected when the voltage across a battery becomes excessively low. When the voltage across the battery which supplies the electromagnetic coil with the electric energy becomes excessively low, the electric current flowing to the electromagnetic coil does not exceeds the predetermined value.

SUMMARY OF THE INVENTION

It is a primary object of this invention to provide an apparatus which effectuate the sequential constant voltage and constant current controls on the electromagnetic valve in a simplified and different manner from the abovedescribed known apparatus.

It is a further object of this invention to provide an apparatus which is enabled to effectuate the sequential constant voltage and constant current controls on the electromagnetic valve with the excessively lowered voltage.

To attain these objects, constant current control on the electromagnetic valve is limited to a predetermined constant time period and the electromagnetic valve not subjected to these sequential controls with the excessively lowered voltage.

DESCRIPTION OF THE PREFERRED EMBODIMENTS

Figure 1:
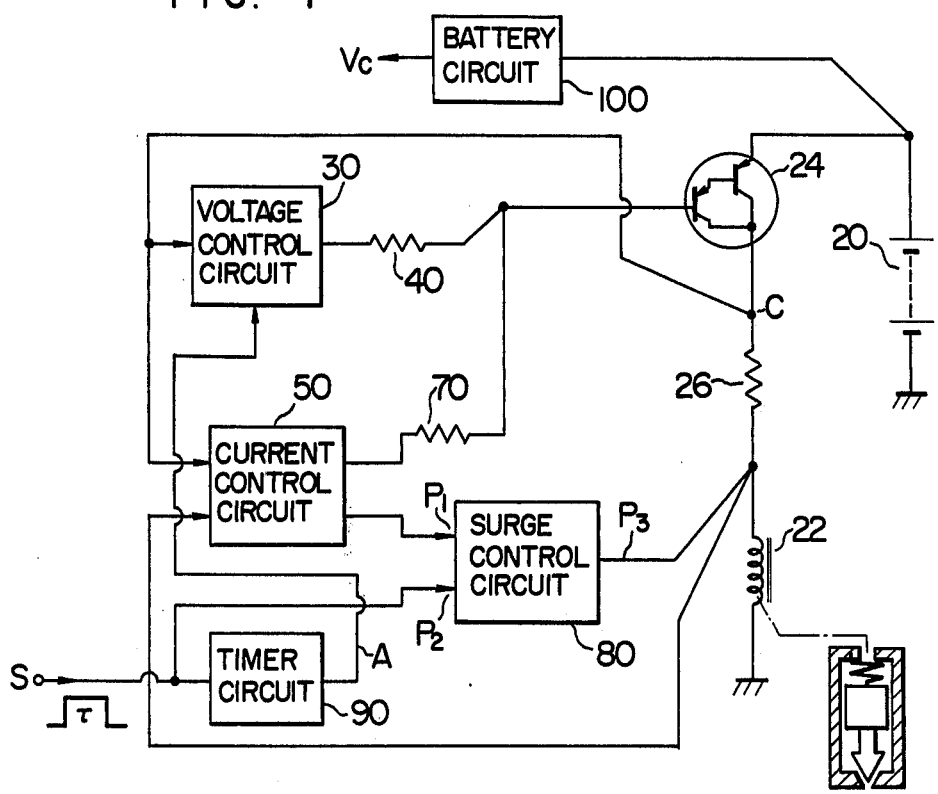
FIG. 1 is a circuit diagram showing a first embodiment of an electromagnetic valve control apparatus according to the invention.

The present invention will now be described with reference to the illustrated embodiments. Referring first to FIG. 1, there is illustrated a first embodiment of the invention. In the Figure, numeral 20 designates a battery having its negative terminal connected to the ground and its positive terminal connected to the emitter of a Darlington connection PNP power transistor 24. The collector of the power transistor 24 is connected to one end of a current detecting resistor 26 having its other end connected to one end of an electromagnetic valve coil 22. The other end of the electromagnetic valve coil 22 is grounded. Numeral 30 designates a voltage control circuit having its input connected to the collector of the power transistor 24 and its output connected to the base of the power transistor 24 through a resistor 40. Numeral 50 designates a current control circuit having its inputs connected to the ends of the current detecting resistor 26 and its outputs respectively connected to the base of the power transistor 24 through a resistor 70 and an input terminal $P_1$ of a surge control circuit 80. The surge control circuit 80 has its other input terminal $P_2$ connected to an input terminal S of a timer circuit 90 and its output terminal $P_3$ connected to the positive terminal of the electromagnetic valve coil 22. Applied from an external controller to the input terminal S of the timer circuit 90 is a pulse signal of time width $\tau$ for controlling the duration of opening and closing of the electromagnetic valve, and the output of the timer circuit 90 is connected to another input of the voltage control circuit 30. Numeral 100 designates a battery circuit connected to the battery 20 to apply a fixed voltage $V_C$ (e.g., 8 Volts) to the voltage control circuit 30, the current control circuit 50, the surge control circuit 80 and the timer circuit 90.

Figure 2:
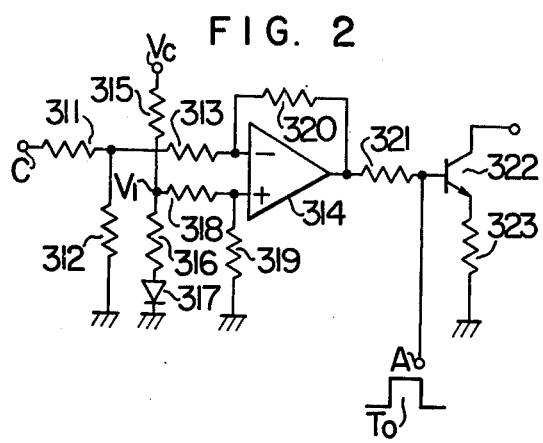
FIG. 2 is a circuit diagram showing in detail the voltage control circuit used in the apparatus of the invention.

FIG. 2 shows in detail the voltage control circuit 30. In the Figure, resistors 311 and 312 are connected between a terminal C and the ground so as to divide the collector voltage of the power transistor 24 shown in FIG. 1, and the junction point of the resistors 311 and 312 is connected to the inverting input terminal (−) of an operational amplifier 314 through a resistor 313. Resistors 315 and 316 and a diode 317 are connected in series between the output terminal of the battery circuit 100 and the ground so as to generate a fixed voltage $V_1$ at the junction point of the resistors 315 and 316. Resistors 318 and 319 are connected to the noninverting input terminal (+) of the operational amplifier 314 so as to divide the fixed voltage $V_1$. A negative feedback resistor 320 is connected between the input and output terminals of the operational amplifier 314. The output terminal of the operational amplifier 314 is connected to the base of a transistor 322 through a resistor 321, and the base of the transistor 322 is connected to the output terminal A of the timer circuit 90. The transistor 322 has its collector connected to the resistor 40 shown in FIG. 1 and its emitter connected to the ground through a resistor 323, so that when the voltage obtained by dividing the voltage at the terminal C becomes higher than the fixed voltage $V_1$, the output voltage of the operational amplifier 314 decreases and the collector voltage of the transistor 322 increases. On the contrary, when the voltage obtained by dividing the voltage at the terminal C becomes lower than the fixed voltage $V_1$, the output voltage of the operational amplifier 314 increases and the collector voltage of the transistor 322 decreases. In other words, as long as a pulse signal of a constant time width $T_o$ is being applied to the terminal A, the voltage control circuit 30 generates a voltage which varies in the same direction as the voltage at the terminal C. When no pulse signal is applied to the terminal A, the transistor 322 is held off and consequently the output voltage of the voltage control circuit 30 remains constant.

Figure 3:
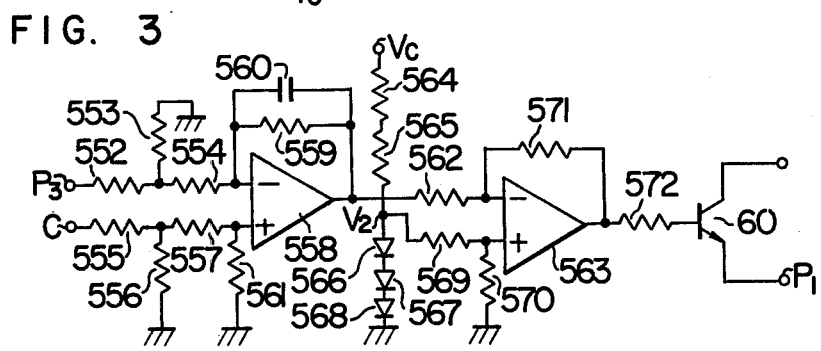
FIG. 3 is a circuit diagram showing in detail the current control circuit used in the apparatus of the invention.

FIG. 3 shows in detail the current control circuit 50. In the Figure, resistors 552 and 554 are connected in series between the terminal $P_3$ and the inverting terminal (−) of an operational amplifier 558, and a resistor 553 is connected between the ground and the junction point of the resistors 552 and 554. Resistors 555 and 557 are connected in series between the terminal C and the noninverting input terminal (+) of the operational amplifier 558, and a resistor 556 is connected between the ground and the junction point of the resistors 555 and 557. A resistor 559 and a capacitor 560 are connected in parallel with each other in the negative feedback circuit of the operational amplifier 558, and a grounded resistor 561 is connected to the noninverting input terminal (+) of the operational amplifier 558. The capacitor 560 is provided to prevent oscillations, and the operational amplifier 558 functions as a differential amplifier. The output terminal of the operational amplifier 558 is connected to the inverting input terminal (−) of an operational amplifier 563 through a resistor 562, and a negative feedback resistor 571 is connected between the input and output terminals of the operational amplifier 563. Resistors 564 and 565 and diodes 566, 567 and 568 are connected in series between the battery circuit 100 and the ground. Connected in parallel with the diodes 566, 567 and 568 are resistors 569 and 570 whose junction point is connected to the noninverting input terminal (+) of the operational amplifier 563. The output terminal of the operational amplifier 563 is connected to the base of a transistor 60, and the transistor 60 has its collector and emitter respectively connected to the resistor 70 and the terminal $P_1$.

In operation, when the voltage between the terminals C and $P_3$ increases, the output voltage of the operational amplifier 558 increases, whereas when the voltage between the terminals C and $P_3$ decreases, the output voltage of the operational amplifier 558 also decreases. The operational amplifier 563 amplifies the differential voltage between the output voltage of the operational amplifier 558 and a fixed voltage $V_2$. Consequently, when the output voltage of the operational amplifier 558 exceeds the fixed voltage $V_2$, the output voltage of the operational amplifier 563 decreases, whereas when the output voltage of the operational amplifier 558 becomes lower than the fixed voltage $V_2$, the output voltage of the operational amplifier 563 increases. The base voltage of the transistor 60 varies in proportion to the output voltage of the operational amplifier 563 and consequently the collector current of the transistor 60 increases with increase in the output voltage of the operational amplifier 563. As just described, the current control circuit 50 operates so that a current is produced which increases and decreases in the opposite direction to the variations of the voltage between the terminals C and $P_3$, thereby providing the constant current corresponding to the fixed voltage $V_2$.

Figure 4:
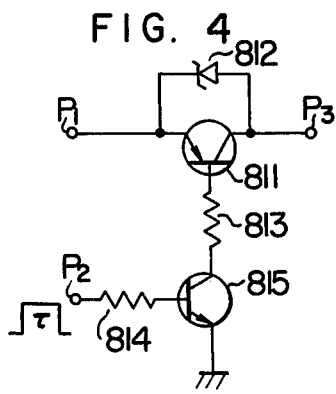
FIG. 4 is a circuit diagram showing in detail the surge control circuit used in the apparatus of the invention.

FIG. 4 shows in detail the surge control circuit 80. In the Figure, a PNP transistor 811 has its emitter connected to the terminal $P_1$, its collector connected to the terminal $P_3$ which is connected to the electromagnetic valve coil 22 and its base connected to the collector of an NPN transistor 815 through a resistor 813. A Zener diode 812 has a fixed Zener voltage (40 Volts) and its positive and negative terminals are connected respectively to the collector and emitter of the transistor 811. The transistor 815 has its emitter connected to the ground and its base connected to the terminal $P_2$ through a resistor 814. So long as a pulse signal $\tau$ is applied to the terminal $P_2$, the transistors 815 and 811 are turned on and the current flowing from the current control circuit 50 to the terminal $P_1$ flows to the terminal $P_3$ through the transistor 811.

Figure 5:
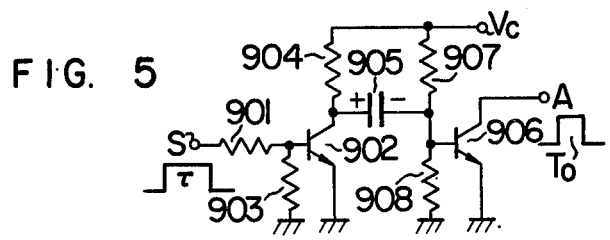
FIG. 5 is a circuit diagram showing in detail the timer circuit used in the apparatus of the invention.

FIG. 5 shows in detail the timer circuit 90. In the Figure, the base of a transistor 902 is connected to the terminal S through a resistor 901, and a resistor 903 is connected in parallel between the base and emitter of the transistor 902. The collector of the transistor 902 is connected to the battery circuit 100 through a resistor 904 and to the positive terminal of a capacitor 905. The negative terminal of the capacitor 905 is connected, along with resistors 907 and 908, to the base of a transistor 906 whose emitter is grounded. The resistor 907 is connected to the battery circuit 100 and the resistor 908 is grounded. When no pulse signal $\tau$ is applied to the terminal S, the transistor 902 is turned off and the transistor 906 is turned on. When a pulse signal $\tau$ is applied to the terminal S, the transistor 902 is turned on so that the positive and negative terminals of the capacitor 905 respectively drop to the ground potential and negative potential. Consequently, the transistor 906 is turned off and the potential at the terminal A goes to a high level. Thereafter, as the potential at the negative terminal of the capacitor 905 is gradually increased by the current flowing through the resistor 907 so that it eventually exceeds the ground potential, the transistor 906 is again turned on and the potential at the terminal A goes to a low level. With the transistor 906 being turned off, a pulse signal $T_o$ is generated whose time width $T_o$ is a fixed time width which is determined by the capacitor 905 and the resistor 907. This time width $T_o$ is preset to correspond to the time required for the electromagnetic valve to more from its closed position to a fully opened position.

Figure 6:
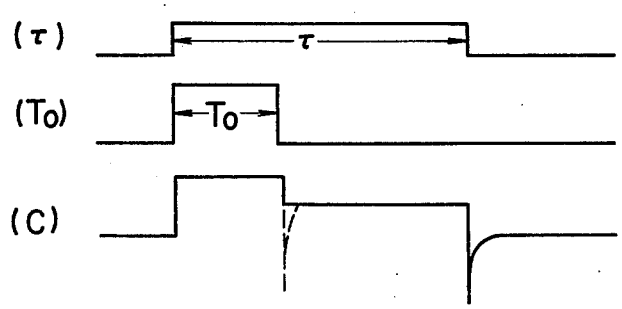
FIG. 6 is a signal waveform diagram useful for explaining the operation of the apparatus of the invention.

With the construction described above, the operation of the apparatus will now be described with reference to the signal waveform diagram of FIG. 6. When the pulse signal $\tau$ shown in ($\tau$) of FIG. 6 is applied to the timer circuit 90, the timer circuit 90 generates at the terminal A a timing signal of a pulse duration $T_o$ as shown in ($T_o$) of FIG. 6. The voltage control circuit 30 comes into operation only for the duration of the time interval $T_o$ during which the signal $T_o$ remains at the "1" state, thus operating the electromagnetic valve coil 22. In this case, the collector voltage of the power transistor 24 is detected so that when the collector voltage becomes higher than the preset voltage corresponding to the fixed voltage $V_1$ due to variation of the supply voltage from the battery 20 or the like, the base current of the power transistor 24 flowing into the output side of the voltage control circuit 30 is reduced to reduce the collector voltage of the power transistor 24, whereas when the collector voltage becomes lower than the preset voltage, the base current of the power transistor 24 flowing into the voltage control circuit 30 is increased to increase the collector voltage. In this way, the collector voltage of the power transistor 24 is controlled at a predetermined fixed voltage.

On the other hand, the current control circuit 50 receives as its input the voltage developed across the current detecting resistor 26, whereby when the voltage drop across the resistor 26 increases in proportion to the increase in the current flowing in the electromagnetic valve coil 22, the current control circuit 50 comes into control operation so that the constant current flowing through the input terminal $P_1$ of the surge control circuit 80 is decreased and consequently the base current flowing to the power transistor 24 is decreased, thus decreasing the collector current of the power transistor 24 and thereby decreasing the voltage across the resistor 26. In the present embodiment, the resistance value of the resistor 26 is selected as 0.1 ohm.

Here, the constant-voltage control and the constant-current control are adapted to subject the base of the power transistor 24 to the OR control through the resistors 40 and 70. In other words, when the current flowing into the voltage control circuit 30 is greater than the value of the current flowing into the current control circuit 50, the power transistor 24 is controlled by the voltage control circuit 30 and thus the entire circuitry comes into the constant-voltage operation, whereas when the current flowing into the voltage control circuit 30 is smaller than that flowing into the current control circuit 50, the entire circuitry is subjected to the constant-current control. When the circuitry comes into the constant-voltage operation, the collector voltage of the power transistor 24 becomes 10 Volts. In other words, when the timing signal $T_o$ shown in ($T_o$) of FIG. 6 is at "1", the voltage control circuit 30 comes into operation, whereas when the timing signal $T_o$ is at "0", the current flowing to the output of the voltage control circuit 30 is cut off, thus stopping its operation. On the other hand, the current control circuit 50 is brought into operation by the surge control circuit 80 when the pulse signal $\tau$ is at "1", and the current control circuit 50 is brought out of operation when the pulse signal $\tau$ is at "0". Consequently, considering the operation of the electromagnetic valve coil 22 from the standpoint of the circuitry on the whole, in response to the application of the pulse signal $\tau$ the electromagnetic valve coil 22 comes first into the constant-voltage operation and then it comes into the constant-current operation. By virtue of this operating method, as shown in (C) of FIG. 6, during the starting period of the electromagnetic valve the constant-voltage control is effected thus applying a high voltage and thereby facilitating the starting of the electromagnetic valve from its closed position to its open position, and thereafter the constant-current control is effected thus holding the electromagnetic valve open by means of a relatively small current and eliminating the effects of variations in the power supply voltage.

Figure 7:
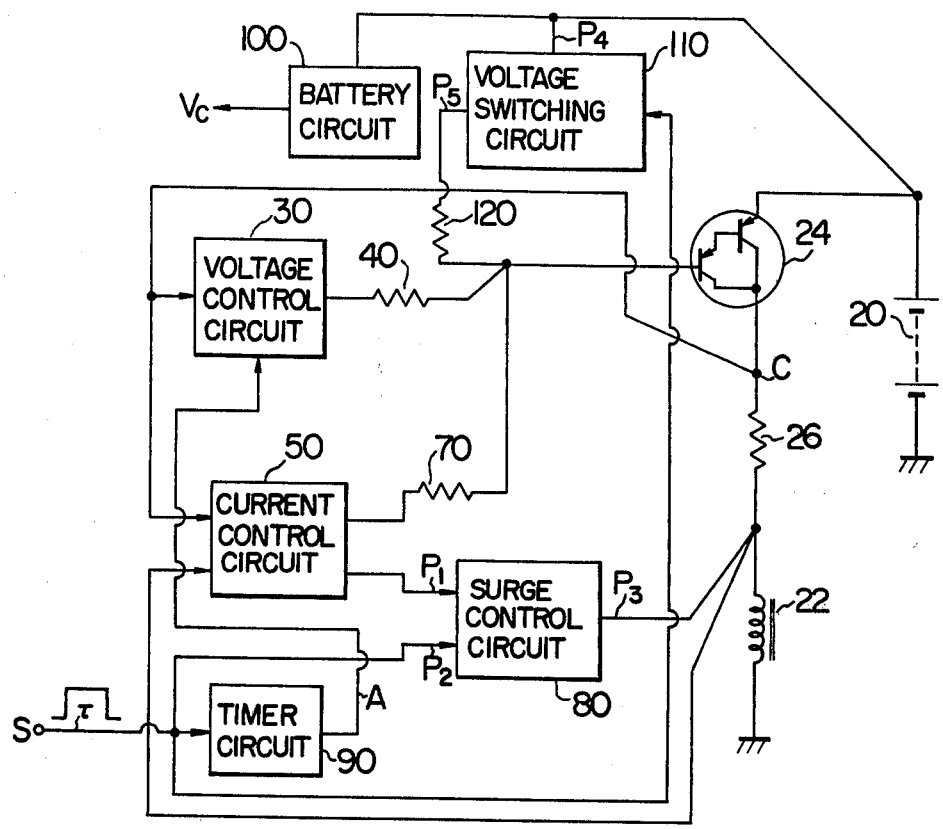
FIG. 7 is a circuit diagram showing a second embodiment of the apparatus of the invention.

In the above-described operation, during the transition from the constant-voltage control to the constant-current control, the current flowing to the electromagnetic valve coil 22 changes from the high to low level and consequently a negative surge voltage of about 50 volts tends to occur at the positive terminal of the electromagnetic valve coil 22 as shown by the dotted line in (C) of FIG. 7. In this case, however, the PNP transistor 811 of the surge control circuit 80 is turned on, with the result that the more the negative surge voltage tends to occur, the more the voltage across the resistor 26 will be increased, and consequently the current control circuit 50 functions to suppress the base current of the power transistor 24 and thereby to reduce the collector current. In this case, the base voltage of the output transistor 60 in the current control circuit 50 can be reduced at the most to the ground voltage of 0 volt. However, since the voltage at the positive terminal of the electromagnetic valve coil 22 is negative, even if the output of the current control circuit 50 is 0 volt, the current flows in the transistor 60 through its base-emitter path and the emitter-collector path of the transistor 811 in the surge control circuit 80, with the result that the current flows through the base of the power transistor 24, the resistor 70 and the current control circuit 50 and consequently the collector current of the power transistor 24 is increased, thus cancelling the negative surge voltage as shown in (C) of FIG. 6. Thus, during the transition from the constant-voltage control to the constant-current control the occurrence of a negative surge voltage at the positive terminal of the electromagnetic valve coil 22 is prevented, thus eliminating the risk of a situation arising in which the electromagnetic valve that has been opened is caused to close again.

On the other hand, when the pulse signal $\tau$ changes from the "1" state to the "0" state, the transistor 815 is turned off and the PNP transistor 811 is turned off, thus stopping the constant-current control. Also in this case, a negative surge voltage is of course produced at the positive terminal of the electromagnetic valve coil 22. However, if the occurrence of this surge voltage is prevented in the previously mentioned manner, there will be a disadvantage that the actual closing time of the electromagnetic valve will be delayed by more than two times over that when the occurrence of such surge voltage is allowed. Thus, at this time the negative surge voltage must be allowed to occur as shown in (C) of FIG. 6 so as to forcibly close the electromagnetic valve. However, if a negative surge voltage of an excessively large value, e.g., 200 volts is allowed to occur, there will be a risk of exceeding the withstand voltages of the power transistor 24 and the transistor 811 and causing breaking down of these transistors. As a result, such negative surge voltage must be controlled at certain values. The actual measurements have shown that the closing time of the electromagnetic valve can be maintained substantially constant if a negative surge voltage of over about 35 volts is allowed to occur. Thus, with the Zener diode 812 having a Zener voltage of 40 volts and provided in the surge control circuit 80 as shown in FIG. 4, even if the PNP transistor 811 is off, when a negative surge voltage exceeds 40 volts, the transistor 811 is turned on, so that more current flows to the collector of the power transistor 24 and the negative surge voltage is cancelled through the previously mentioned operation. Of course, the withstand voltages of the base-collector section and emitter-collector section of the transistor 811 and the power transistor 24 must be higher than 40 volts.

While, in the above-described embodiment, the surge control circuit 80 is connected between the current control circuit 50 and the positive terminal of the electromagnetic valve coil 22, it is evident that the surge control circuit 80 may be connected between the voltage control circuit 30 and the electromagnetic valve coil 22 and that the surge control circuit 80 may be connected to the collector terminal of the power transistor 24 in place of the electromagnetic valve coil 22.

Now considering the operation of the embodiment as a whole, when a pulse signal $\tau$ is applied, the apparatus is first subjected to constant-voltage control for about 1.8 ms and then it is subjected to constant-current control unit the signal $\tau$ goes to "0", with the result that even if the voltage of the battery 20 is varied, the current supply to the electromagnetic valve coil 22 is maintained constant and consequently the durations of opening and closing of the electromagnetic valve remain unchanged, thus stably opening the electromagnetic valve for the duration of the pulse signal $\tau$. Assuming now that $\tau$ON represents the time interval from the instant that a pulse signal $\tau$ is applied until the electromagnetic valve is completely opened and $\tau$OFF represents the time interval from the instant that the signal $\tau$ goes to "0" until the electromagnetic valve is completely closed, a time interval $\tau'$ during which the electromagnetic valve actually remain open after the application of the pulse signal $\tau$ is given by $\tau = \tau - \tau ON + \tau OFF = \tau - (\tau ON - \tau OFF)$. In this embodiment, the time intervals $\tau$ON and $\tau$OFF remain unchanged despite any variations in the voltage of the battery 20, and consequently the time interval $\tau'$ remains constant despite the variations in the voltage of the battery 20.

Figure 8:
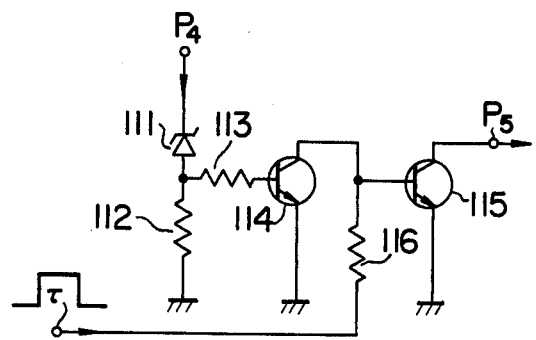
FIG. 8 is a circuit diagram showing in detail the voltage switching circuit used in the apparatus of the invention.

Referring now to FIG. 7, there is illustrated a second embodiment of the invention. The second embodiment is identical with the first embodiment except that a voltage switching circuit 110 and a resistor 120 are added to the previously described circuitry of FIG. 1. With this construction, even if the voltage of the battery 20 constituting the power source decreases abnormally, the electromagnetic valve coil 22 is continuously operated. The operation of the voltage switching circuit 110 will now be described with reference to the detailed circuit diagram of FIG. 8. In the Figure, the negative terminal of a Zener diode 111 is connected through a terminal P4 to the positive terminal of the battery 20, and the positive terminal of the Zener diode 111 is grounded through a resistor 112. The Zener voltage of the Zener diode 111 is 7 volts. The positive terminal of the Zener diode 111 is also connected to the base of a transistor 114 through a resistor 113. The transistor 114 has its emitter grounded and its collector connected to the base of the following transistor 115. The transistor 115 has its emitter grounded and its collector connected to the base of the power transistor 24 by way of the resistor 120 shown in FIG. 7. On the other hand, the base of the transistor 115 is connected through a resistor 116 to the input of the timer circuit 90.

With the circuit construction described above, the operation of the second embodiment is as follows. So long as the voltage of the battery 20 remains higher than 7 volts, the Zener diode 111 and the transistor 114 are turned on so that the transistor 115 is turned off irrespective of the presence or absence of an input pulse signal $\tau$ and the transistor 115 is disconnected with the base of the power transistor 24. Consequently, the voltage switching circuit 110 is not brought into operation. When the voltage of the battery 20 drops below 7 volts, the transistor 114 is turned off, with the result that when the input pulse signal $\tau$ goes to "1", the transistor 115 is turned on so that current flows to the transistor 115 through the base of the power transistor 24 and the resistor 120 and current flows to the electromagnetic valve coil 22 thus opening the electromagnetic valve, whereas when the pulse signal $\tau$ goes to "0" the electromagnetic valve is closed. In this case, the power transistor 24 is fully conducting. With the voltage of the battery 20 being lower than 7 volts, while the voltage control circuit 30 and the current control circuit 50 are not brought into normal operation, the power transistor 24 comes into operation in response to the output signal of the voltage switching circuit 110. Since the power transistor 24 is rendered fully conductive by the voltage switching circuit 111 and since the power transistor 24 is a PNP transistor, its emitter-collector voltage drop is on the order of 0.5 to 0.7 volt and considerably lower than that of an NPN power transistor which is on the order of 1.5 to 2.0 volts, and this is advantageous in the event that the battery voltage is decreased.

The reason for reducing the minimum operating voltage in this way is that where the electromagnetic valve is used as an injection valve for the gasoline fuel injection system of an automobile, the vehicle battery will be used as a power source. Thus, if the battery is in a more or less run-down condition, the battery voltage will be reduced to about 5 volts during the starting period where the starting motor is operated. In the case of the present embodiment, even with the battery voltage of 5 volts, it is possible to inject gasoline and start the engine with a higher possibility, though the pulse duration of injection pulses will not be accurate. When starting the starting motor, the pulse duration of injection pulses may be increased somewhat so as to facilitate the starting of the engine.

It will thus be seen from the foregoing description that since the apparatus of this invention comprises a series circuit connected to a power source and including an amplifying element, a current detecting element and an electromagnetic valve coil, a voltage control circuit responsive to an electromagnetic valve control signal to subject the output of the amplifying element to voltage control operation, a current control circuit adapted to receive as an input the detection signal from the current detecting element and responsive to the electromagnetic valve control signal to subject the output of the amplifying element to current control operation, and a surge control circuit connected to the electromagnetic valve coil for selectively controlling a surge voltage produced during the change in the control operation of the output of the amplifying element, there is a great advantage of stably controlling the energization of the electromagnetic valve coil despite variations in the supply voltage and the like and thereby ensuring satisfactory protection of such element as the amplifying element in the series circuit including the electromagnetic valve coil.

What is claimed is:

1. An apparatus for controlling an electromagnetic valve operable during energization of the electromagnetic coil thereof connected in series with a direct current power source through the emitter-collector path of a power transistor comprising:

voltage control means connected to said coil and to the base of said power transistor for controlling the base current of said power transistor in response to changes in the voltage across said coil to thereby maintain a constant value of the voltage across said coil;

current control means connected to said coil and to the base of said power transistor for controlling the base current of said power transistor in response to changes in the electric current flowing through said coil to thereby maintain a constant value of the electric current flowing through said coil;

time control means connected to receive an input pulse signal having a pulse duration which determines energization duration of said coil for sequentially effecting control operations of said voltage control means and said current control means, said time control means effecting the voltage control operation of said voltage control means during a predetermined constant duration synchronized with and shorter than said pulse duration of said input pulse signal and than effecting the current control operation of said current control means during the remaining duration of said input pulse signal; and surge control means connected to said coil for increasing the electric current flowing from said power transistor to said coil, cooperatively with said current control means, in response to a surge voltage produced by said coil upon the change from said voltage control operation to said current control operation.

2. An apparatus according to claim 1 further comprising:

voltage switching means connected to be responsive to the voltage across said d.c. power source and to said input pulse signal, said voltage switching means rendering said power transistor conductive during the pulse duration of said input pulse signal independently of the control operations of said voltage and current control means when the voltage across said d.c. power source is decreased below a predetermined voltage.

3. An apparatus according to claim 2, wherein said power transistor is a PNP transistor.

4. An apparatus according to claim 1, wherein said voltage control means includes:

a first differential amplifier connected to receive a first constant reference voltage and a voltage produced at the junction between said power transistor and said coil for producing a first output voltage dependent on the difference therebetween; and a first transistor connected between said first differential amplifier and the base of said power transistor for controlling the base current of said power transistor in response to said first output voltage of said first differential amplifier, said first transistor being connected to allow the base current of said power transistor to flow through collector-emitter path thereof.

5. An apparatus according to claim 4, wherein said current control means includes:

a resistor connected in series with said coil and the emitter-collector path of said power transistor for producing a voltage proportional to the electric current flowing through said coil;

a second differential amplifier connected to be responsive to the voltage produced by said resistor and to a second constant reference voltage for producing a second output voltage dependent on the difference therebetween; and a second transistor connected between said second differential amplifier and the base of said power transistor for controlling the base current of said power transistor in response to said second output voltage of said second differential amplifier, said second transistor being connected to allow the base current of said power transistor to flow through collector-emitter path thereof.

6. An apparatus according to claim 5, wherein said surge control means includes:

a third transistor connected to be rendered conductive during said pulse duration of said input pulse signal, said third transistor being connected to allow the electric current flowing through the emitter-collector path of said second transistor to flow through the emitter-collector path thereof to said coil; and a zener diode connected in parallel with the emitter-collector path of said third transistor, said zener diode being rendered conductive when a surge voltage produced by said coil upon deenergization of said coil exceeds a breakdown voltage thereof.

7. An apparatus according to claim 6, wherein said time control means is adapted to produce an output pulse signal in synchronism with said input pulse signal, said output pulse signal having a pulse duration equal to said predetermined constant duration and being applied to the base of said first transistor to thereby render said first transistor operative during said predetermined constant duration.

* * * * *